(12) United States Patent
Toyoshima

(10) Patent No.: US 9,883,584 B2
(45) Date of Patent: Jan. 30, 2018

(54) METHOD OF MANUFACTURING A MULTILAYER FLEXIBLE PRINTED CIRCUIT BOARD

(71) Applicant: NIPPON MEKTRON, LTD., Tokyo (JP)

(72) Inventor: Ryoichi Toyoshima, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 15/503,752

(22) PCT Filed: Aug. 1, 2016

(86) PCT No.: PCT/JP2016/072520
§ 371 (c)(1),
(2) Date: Feb. 14, 2017

(87) PCT Pub. No.: WO2017/022715
PCT Pub. Date: Feb. 9, 2017

(65) Prior Publication Data
US 2017/0280554 A1    Sep. 28, 2017

(30) Foreign Application Priority Data
Aug. 6, 2015 (JP) ................................. 2015-156168

(51) Int. Cl.
*H01K 3/10* (2006.01)
*H05K 1/02* (2006.01)
(Continued)

(52) U.S. Cl.
CPC ............ *H05K 1/028* (2013.01); *H05K 3/062* (2013.01); *H05K 3/28* (2013.01); *H05K 3/384* (2013.01);
(Continued)

(58) Field of Classification Search
CPC .......... H05K 1/028; H05K 3/384; H05K 3/28; H05K 3/4655; H05K 3/062;
(Continued)

(56) References Cited

U.S. PATENT DOCUMENTS 3,876,964 A * 4/1975 Balaster ............... H01B 7/0838
174/254
4,931,134 A * 6/1990 Hatkevitz ............ H05K 3/0035
29/846
(Continued)

FOREIGN PATENT DOCUMENTS

JP    3-270099 A    12/1991
JP    5-343820 A    12/1993
(Continued)

OTHER PUBLICATIONS

International Search Report, dated Oct. 4, 2016 (2 pages).

*Primary Examiner* — Donghai D Nguyen
(74) *Attorney, Agent, or Firm* — Jacobson Holman, PLLC.

(57) ABSTRACT

[Problem to be Solved]
A multilayer flexible printed circuit board having a strip line advantageous to folding is provided.
[Solution]
A multilayer flexible printed circuit board 100 of an embodiment is a multilayer flexible printed circuit board having a strip line foldable at a folding part F1, the board including: a flexible insulative substrate 30; an inner layer circuit pattern 5 provided inside the flexible insulative substrate 30 and including a signal line 6 extending in a predetermined direction; a ground thin film 14a constituting a ground layer at least in the folding part F1 out of a ground layer of the strip line and constituted of a nonelectrolytic plating coat 14 formed on the flexible insulative substrate 30; and a protective layer 20 that covers the ground thin film 14a and is in (Continued)

close contact with an exposed part 19 from which the flexible insulative substrate 30 is exposed.

9 Claims, 16 Drawing Sheets

(51) Int. Cl.
  *H05K 3/46* (2006.01)
  *H05K 3/06* (2006.01)
  *H05K 3/28* (2006.01)
  *H05K 3/38* (2006.01)

(52) U.S. Cl.
  CPC ...... *H05K 3/4655* (2013.01); *Y10T 29/49165* (2015.01)

(58) Field of Classification Search
  CPC ......... Y10T 29/49126; Y10T 29/49128; Y10T 29/49156; Y10T 29/49165
  USPC .................... 29/830, 831, 847, 852; 174/154
  See application file for complete search history.

(56) References Cited

U.S. PATENT DOCUMENTS

| | | | |
|---|---|---|---|
| 8,383,948 B2* | 2/2013 | Aoyama | H05K 3/4069 29/830 |
| 9,374,886 B2* | 6/2016 | Kato | H05K 1/0218 |
| 2003/0116343 A1* | 6/2003 | Adachi | H05K 1/028 174/254 |
| 2011/0030995 A1* | 2/2011 | Lee | H01P 3/087 174/251 |
| 2014/0118969 A1 | 5/2014 | Lee | |
| 2015/0342030 A1* | 11/2015 | Watanabe | H05K 1/0216 174/268 |

FOREIGN PATENT DOCUMENTS

| | | |
|---|---|---|
| JP | 2001-24339 A | 1/2001 |
| JP | 2006-66525 A | 3/2006 |
| JP | 2006-173310 A | 6/2006 |
| JP | 2009-218447 A | 9/2009 |
| JP | 2010-16339 A | 1/2010 |
| JP | 4583149 B2 | 9/2010 |
| JP | 2013-4728 A | 1/2013 |
| WO | 2014/069061 A1 | 5/2014 |

* cited by examiner

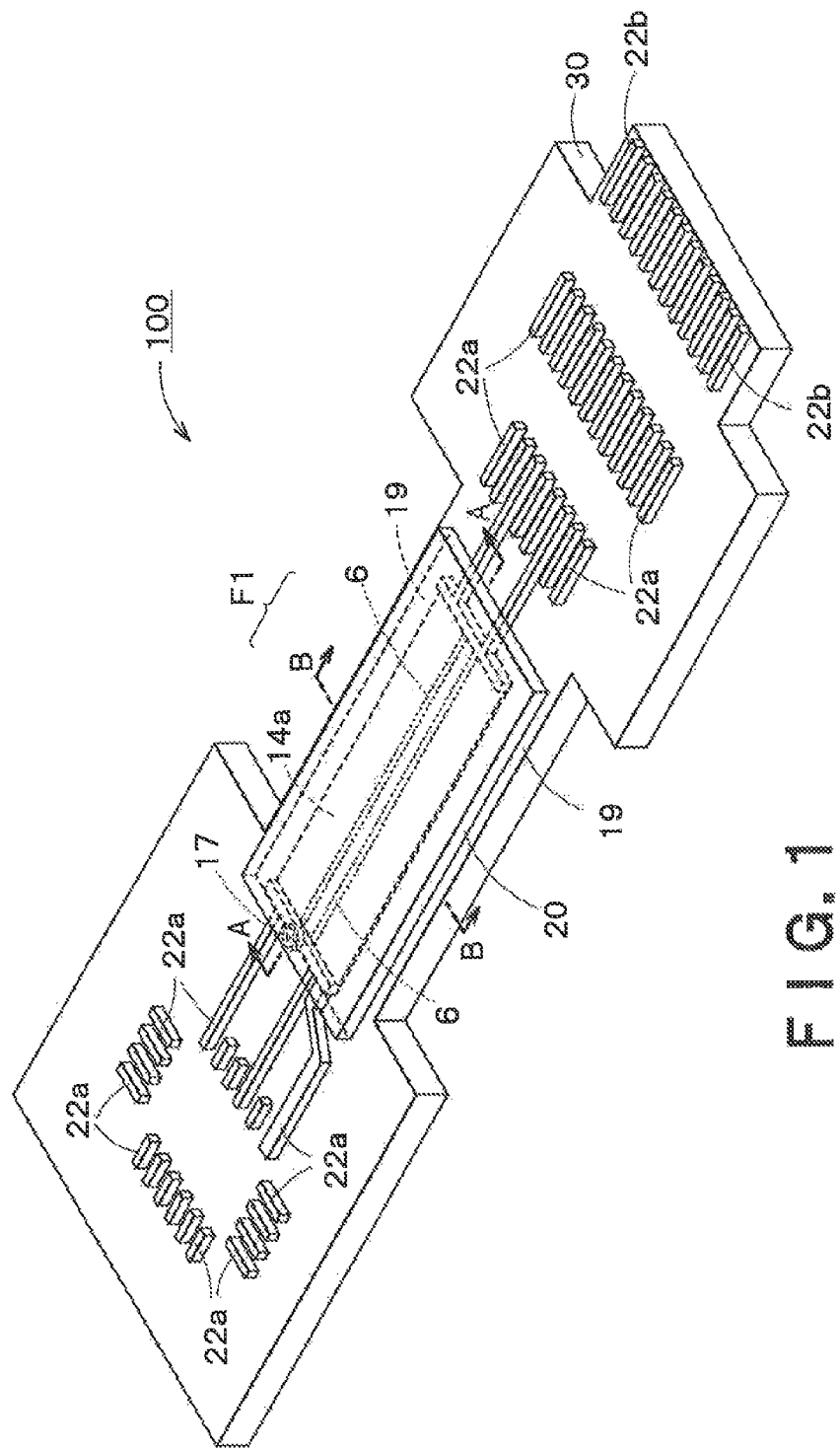
F I G. 1

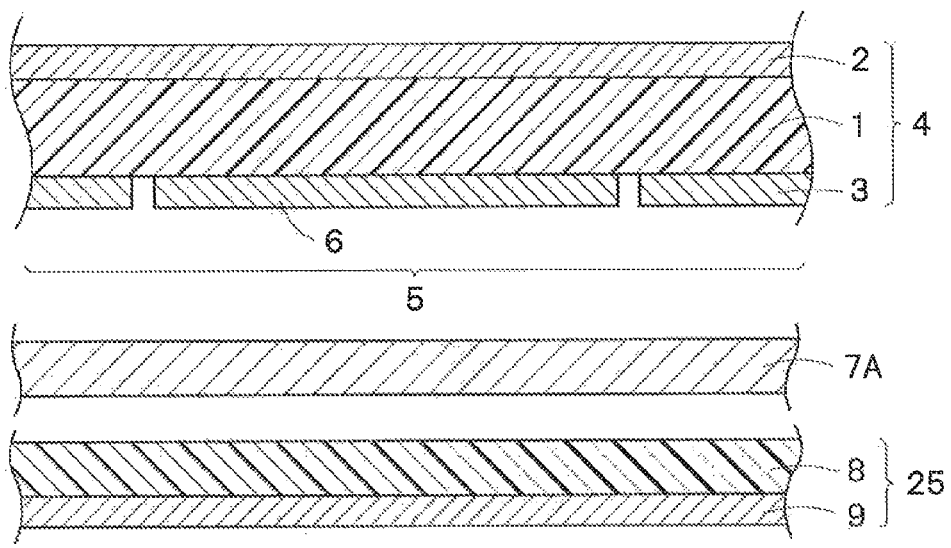
F I G. 4A
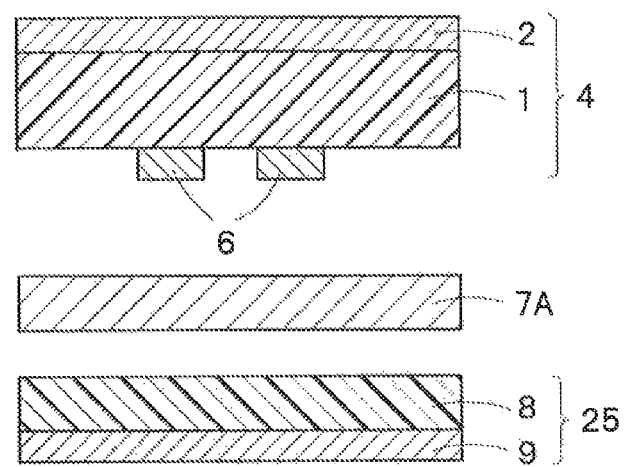
F I G. 4B

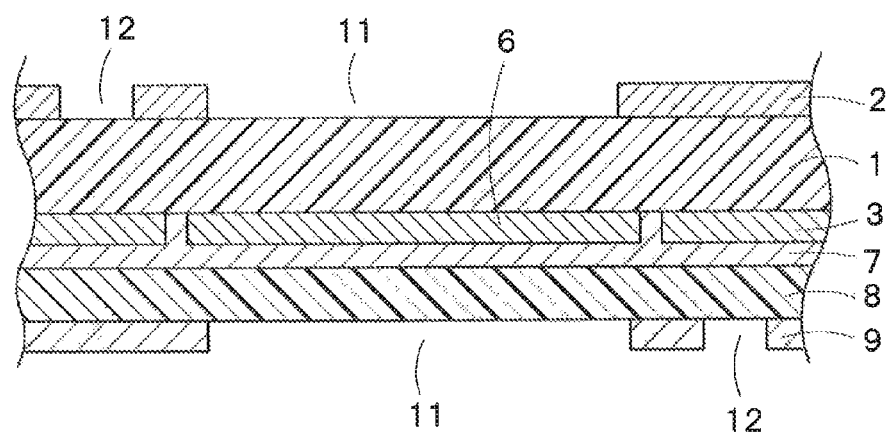
F I G. 6A
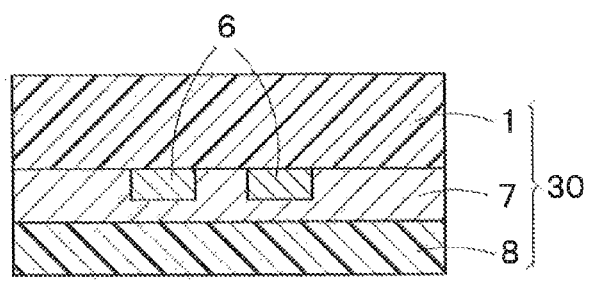
F I G. 6B

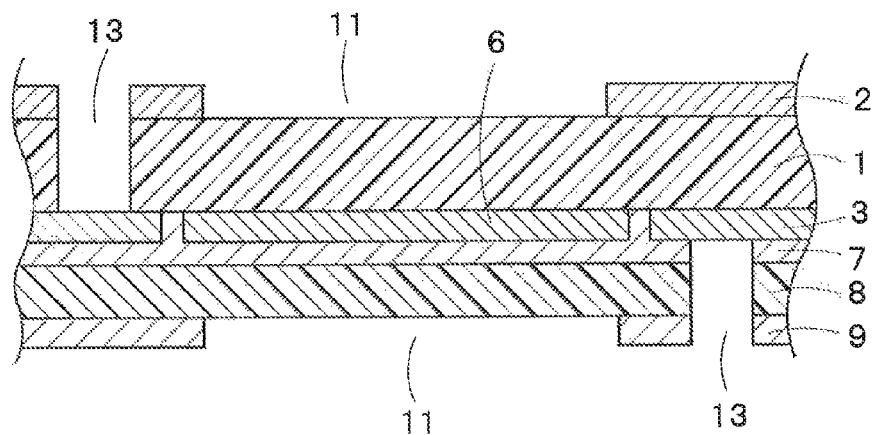
F I G. 7A
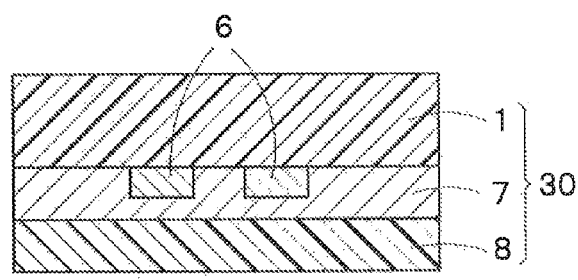
F I G. 7B

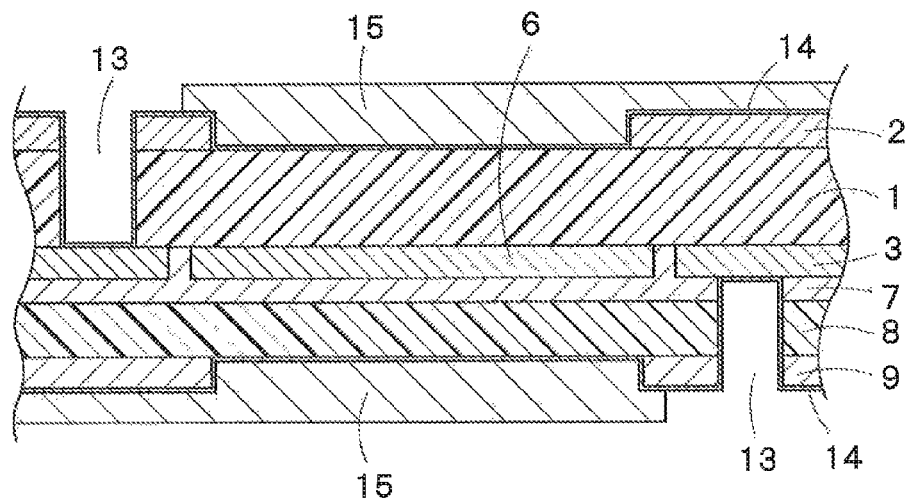
F I G. 9A
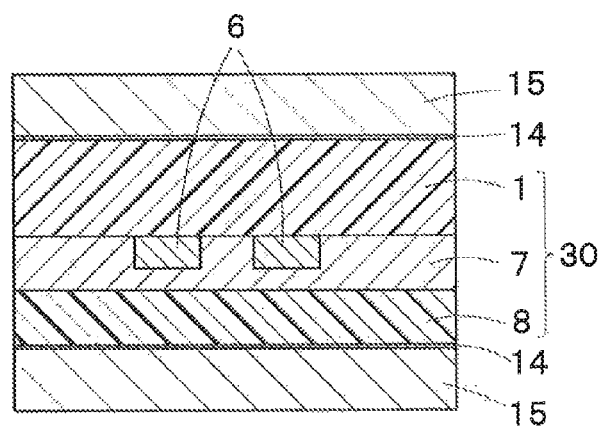
F I G. 9B

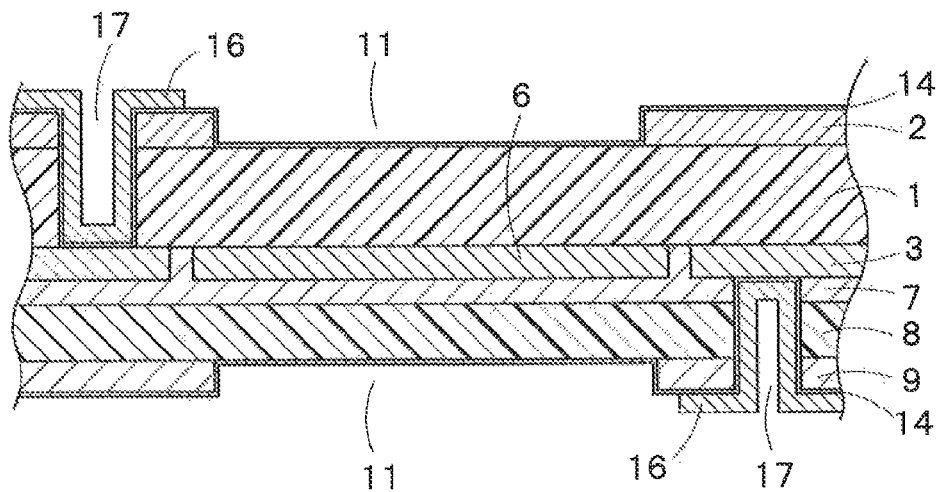
F I G. 10A
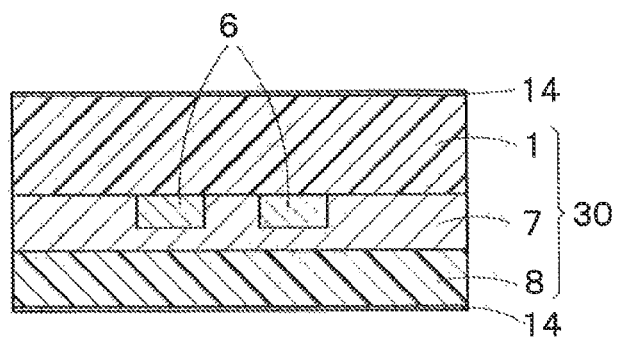
F I G. 10B

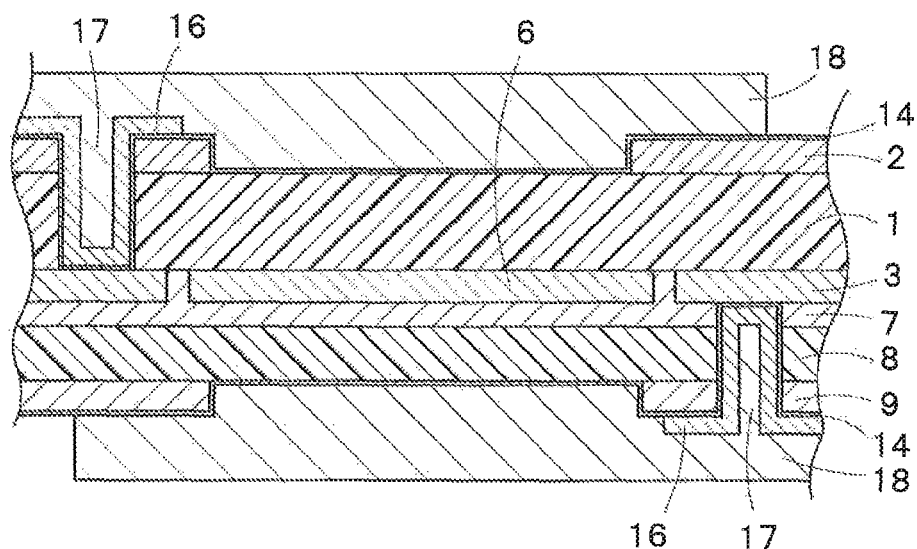
F I G. 11A
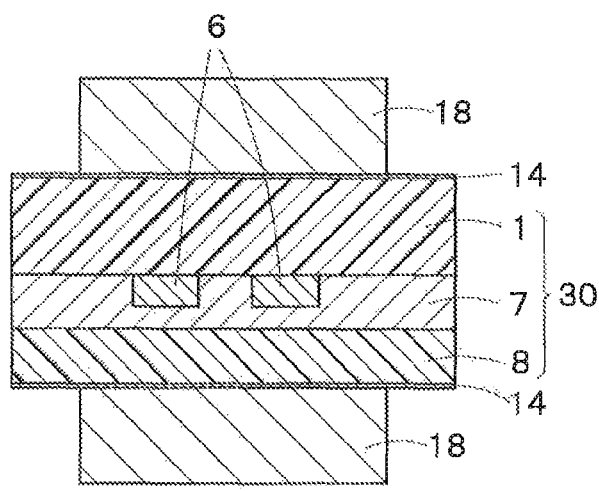
F I G. 11B

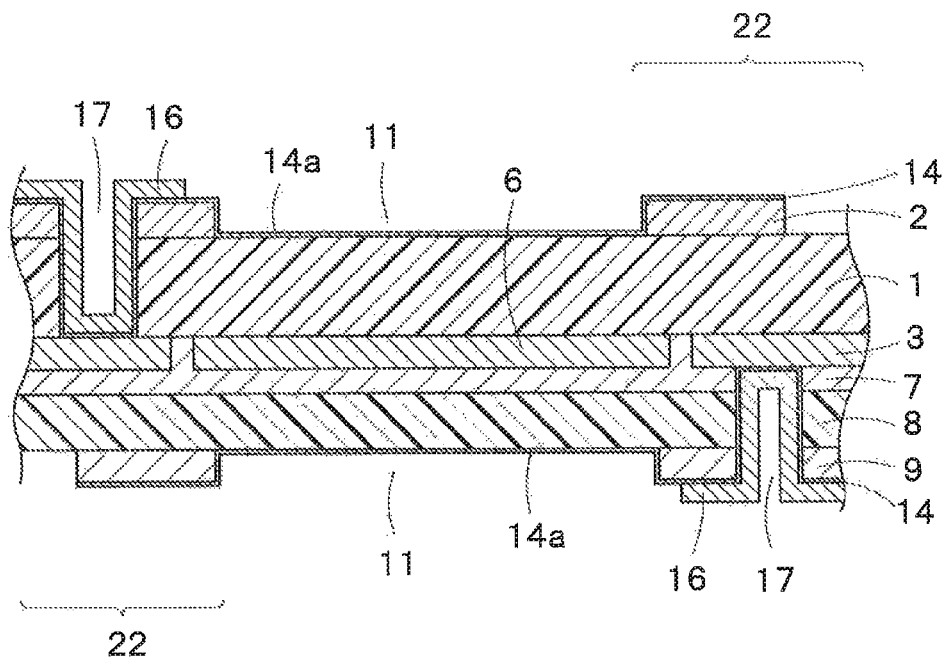
F I G. 12A
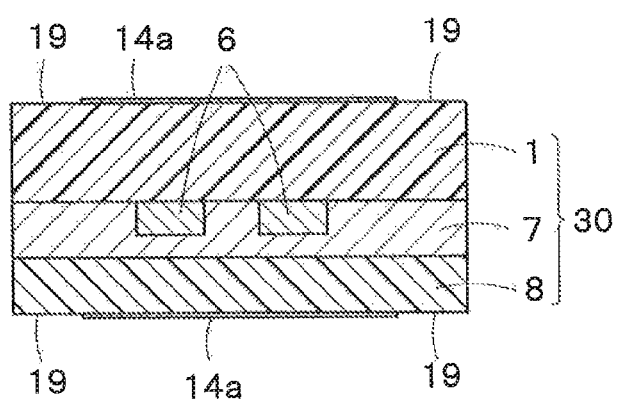
F I G. 12B

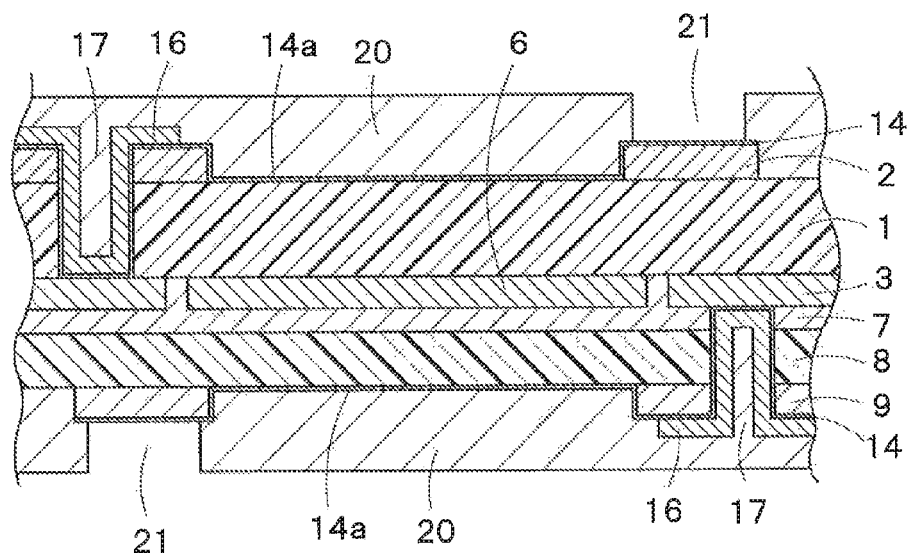
F I G. 13A
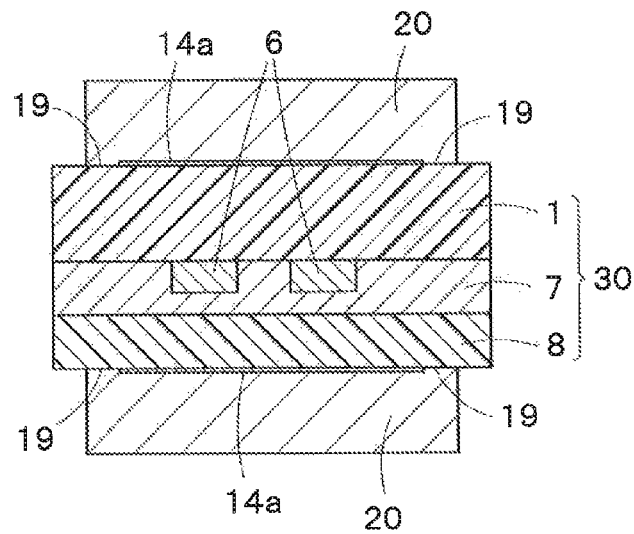
F I G. 13B

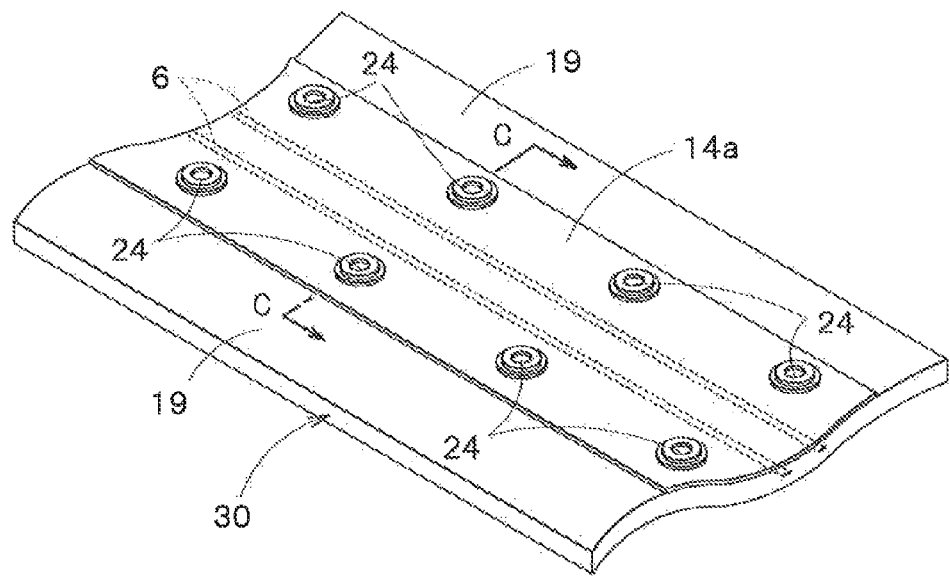
F I G. 16A
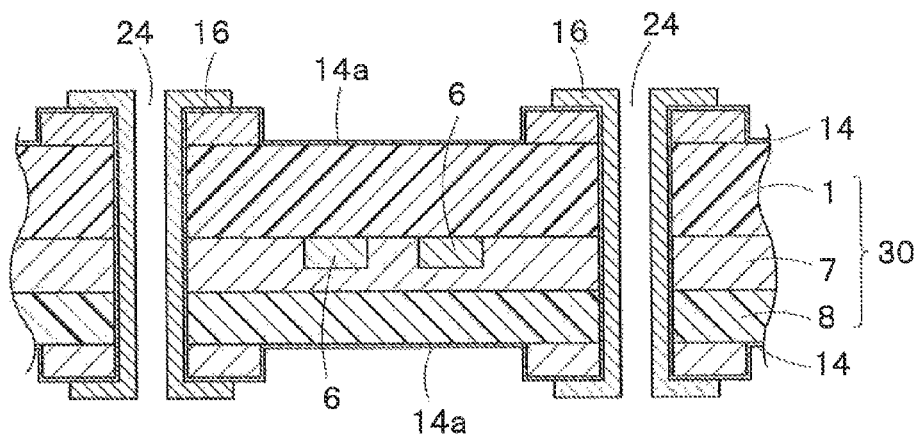
F I G. 16B

METHOD OF MANUFACTURING A MULTILAYER FLEXIBLE PRINTED CIRCUIT BOARD

TECHNICAL FIELD

The present invention relates to a multilayer flexible printed circuit board and a method of manufacturing the same, and more specifically relates to a multilayer flexible printed circuit board having a foldable strip line, and a method of manufacturing the same.

BACKGROUND ART

In electronic devices such as a mobile phone, a smart phone, a tablet terminal and a digital camera, multilayer flexible printed circuit boards are used along with downsizing, lightening and higher performance. Higher performance and higher functionality of such electronic devices have been dramatically increasing a data amount handled by the electronic devices in recent years. Moreover, a processing speed of signals in the electronic devices has been further improved as a result of shifting from parallel wiring to serial wiring in order to reduce the area of a substrate. Accordingly, a transmission speed of signals passing through the multilayer flexible printed circuit board has also increased.

A microstrip line and a strip line are conventionally known as transmission paths of high-speed signals. In particular, since the strip line has a structure in which ground layers above and below the same interpose a signal line, it has an advantage of a high shielding effect of electromagnetic waves emitted from the signal line and external electromagnetic waves. Moreover, the strip line can be relatively easily formed in the multilayer flexible printed circuit board.

Patent Literature 1 discloses a multilayer flexible printed circuit board having a strip line. In this multilayer flexible printed circuit board, ground layers of the strip line are constituted of copper foils of a copper clad laminated sheet.

CITATION LIST

Patent Literature

Patent Literature 1: Japanese Patent Laid-Open No. 2010-16339

SUMMARY OF INVENTION

Technical Problem

Now, as to a multilayer flexible printed circuit board having a strip line, the strip line is sometimes folded in assembling its product or in using the product. For example, when the multilayer flexible printed circuit board is attached to the interior of the housing, the strip line of the multilayer flexible printed circuit board is sometimes folded. Moreover, when it is applied onto the hinge of a mobile phone, the strip line is folded in handling the product.

In the strip line of a conventional multilayer flexible printed circuit board, as in Patent Literature 1, the ground layers are constituted of relatively thick copper foils of a copper clad laminated sheet. Moreover, since the ground layer is not positioned at the mechanical center in folding the strip line, stress tends to concentrate on the copper foil of the ground layer due to the folding. For these reasons, it has been difficult for the conventional multilayer flexible printed circuit board to apply the strip line structure to a dynamic site which is needed to be folded many times. Moreover, even in static usage of assembling it in a folded state, there has been a possibility of cracks in the ground layer or breakage of the ground layer still after folded only a fewer times.

The present invention is devised based on the aforementioned technical recognition and an object thereof is to provide a multilayer flexible printed circuit board having a strip line advantageous to folding.

Solution to Problem

A method of manufacturing a multilayer flexible printed circuit board according to the present invention is a method of manufacturing a multilayer flexible printed circuit board having a strip line foldable at a folding part, the method including: a process of preparing a laminate body having a flexible insulative substrate, an inner layer circuit pattern provided inside the flexible insulative substrate and including a signal line extending in a predetermined direction, and metal foils covering both sides of the flexible insulative substrate; an opening part forming process of removing the metal foil at least in the folding part out of a ground layer formation scheduled region to form an opening part from a bottom face of which the flexible insulative substrate is exposed; a nonelectrolytic plating process of forming a nonelectrolytic plating coat on the flexible insulative substrate that is exposed from the bottom face of the opening part by a nonelectrolytic plating method; an etching mask forming process of forming an etching mask covering the nonelectrolytic plating coat; an exposed part forming process of removing the nonelectrolytic plating coat that is not covered by the etching mask to form a ground thin film constituted of the nonelectrolytic plating coat and an exposed part from which the flexible insulative substrate is exposed; and a protective layer forming process of forming a protective layer that covers the ground thin film and is in close contact with the exposed part.

A multilayer flexible printed circuit board according to the present invention is a multilayer flexible printed circuit board having a strip line foldable at a folding part, the board including: a flexible insulative substrate; an inner layer circuit pattern provided inside the flexible insulative substrate and including a signal line extending in a predetermined direction; a ground thin film constituting a ground layer at least in the folding part out of a ground layer of the strip line and constituted of a nonelectrolytic plating coat formed on the flexible insulative substrate; and a protective layer that covers the ground thin film and is in close contact with an exposed part from which the flexible insulative substrate is exposed.

Advantageous Effects of Invention

According to the present invention, a multilayer flexible printed circuit board having a strip line advantageous to folding can be provided.

BRIEF DESCRIPTION OF DRAWINGS

FIG. 1 is an overall perspective view of a multilayer flexible printed circuit board according to an embodiment of the present invention.

Continuing from FIG. 2A.

Continuing from FIG. 2B.

Continuing from FIG. 3A.

Continuing from FIG. 3B, FIG. 4A shows process cross-sectional views for explaining the method of manufacturing a multilayer flexible printed circuit board according to the embodiment.

Continuing from FIG. 4A, FIG. 4B shows process cross-sectional views for explaining the method of manufacturing a multilayer flexible printed circuit board according to the embodiment.

Continuing from FIG. 4B.

Continuing from FIG. 5A.

Continuing from FIG. 5B, FIG. 6A shows process cross-sectional views for explaining the method of manufacturing a multilayer flexible printed circuit board according to the embodiment.

Continuing from FIG. 6A, FIG. 6B shows process cross-sectional views for explaining the method of manufacturing a multilayer flexible printed circuit board according to the embodiment.

Continuing from FIG. 6B, FIG. 7A shows process cross-sectional views for explaining the method of manufacturing a multilayer flexible printed circuit board according to the embodiment.

Continuing from FIG. 7A, FIG. 7B shows process cross-sectional views for explaining the method of manufacturing a multilayer flexible printed circuit board according to the embodiment.

Continuing from FIG. 7B.

Continuing from FIG. 8A.

Continuing from FIG. 8B, FIG. 9A shows process cross-sectional views for explaining the method of manufacturing a multilayer flexible printed circuit board according to the embodiment.

Continuing from FIG. 9A, FIG. 9B shows process cross-sectional views for explaining the method of manufacturing a multilayer flexible printed circuit board according to the embodiment.

Continuing from FIG. 9B, FIG. 10A shows process cross-sectional views for explaining the method of manufacturing a multilayer flexible printed circuit board according to the embodiment.

Continuing from FIG. 10A, FIG. 10B shows process cross-sectional views for explaining the method of manufacturing a multilayer flexible printed circuit board according to the embodiment.

Continuing from FIG. 10B, FIG. 11A shows process cross-sectional views for explaining the method of manufacturing a multilayer flexible printed circuit board according to the embodiment.

Continuing from FIG. 11A, FIG. 11B shows process cross-sectional views for explaining the method of manufacturing a multilayer flexible printed circuit board according to the embodiment.

Continuing from FIG. 11B, FIG. 12A shows process cross-sectional views for explaining the method of manufacturing a multilayer flexible printed circuit board according to the embodiment.

Continuing from FIG. 12A, FIG. 12B shows process cross-sectional views for explaining the method of manufacturing a multilayer flexible printed circuit board according to the embodiment.

Continuing from FIG. 12B, FIG. 13A shows process cross-sectional views for explaining the method of manufacturing a multilayer flexible printed circuit board according to the embodiment.

Continuing from FIG. 13A, FIG. 13B shows process cross-sectional views for explaining the method of manufacturing a multilayer flexible printed circuit board according to the embodiment.

FIG. 16A is a perspective view showing a part of the multilayer flexible printed circuit board according to a second modification.

FIG. 16B is a cross-sectional view taken along the C-C line in FIG. 16A.

DESCRIPTION OF EMBODIMENTS

Figure 2A:
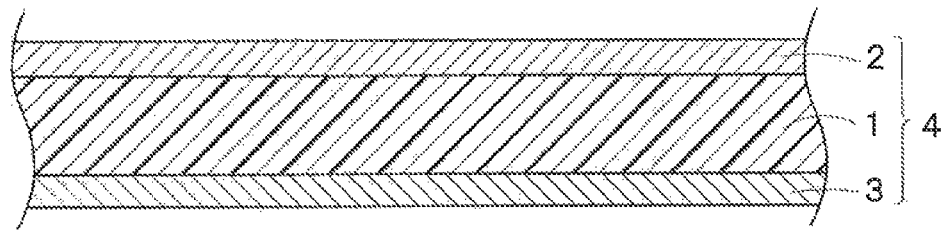
FIG. 2A shows process cross-sectional views for explaining a method of manufacturing a multilayer flexible printed circuit board according to the embodiment.

Hereafter, an embodiment according to the present invention and its modifications are described with reference to the drawings. Notably, elements having equivalent functions are given the same signs in the figures. Moreover, the drawings are schematic, and relations between thicknesses and planar dimensions, ratios between the thicknesses of layers, and the like are different from real ones.

<Multilayer Flexible Printed Circuit Board 100>

A configuration of a multilayer flexible printed circuit board 100 according to an embodiment of the present invention is described with reference to FIG. 1. The multilayer flexible printed circuit board 100 according to the present embodiment has a strip line foldable at a folding part F1. As mentioned later, the multilayer flexible printed circuit board 100 is configured such that the strip line is foldable at least at the folding part F1.

As shown in FIG. 1, the multilayer flexible printed circuit board 100 includes a flexible insulative substrate 30, an inner layer circuit pattern provided inside the flexible insulative substrate 30 (inner layer circuit pattern 5 mentioned later), outer layer circuit patterns provided on both sides of the flexible insulative substrate 30 (outer layer circuit patterns 22 mentioned later), ground thin films 14a constituting at least parts of ground layers of the strip line, and protective layers 20 protecting the ground thin films 14a.

Described later in detail, the flexible insulative substrate 30 has, for example, two insulative base materials pasted together with an adhesive agent, and is flexible.

The inner layer circuit pattern (inner layer circuit pattern 5) is provided inside the flexible insulative substrate 30 and includes signal lines 6 extending in a predetermined direction. In the present embodiment, as shown in FIG. 1, two signal lines 6 are provided for differential transmission and these signal lines 6 extend in the longitudinal direction of the flexible insulative substrate 30. Notably, the number of the signal lines 6 is not limited to this but may be one or three or more.

The outer layer circuit pattern (outer layer circuit pattern 22) is electrically connected to the ground thin film 14a and the inner layer circuit pattern 5. The outer layer circuit pattern 22 includes lands 22a for implementing electronic components (not shown), connector terminals 22b for external connection, and various wiring patterns.

The ground layers of the strip line are provided on both sides of the flexible insulative substrate 30, and form a trilayer strip line structure along with the signal lines 6 in the flexible insulative substrate 30. In the example of FIG. 1, the ground layer is constituted of the ground thin film 14a. The ground layer is thicker than the signal lines 6 so as to function as a solid ground (see FIG. 13B). More in general, the ground layer is formed so as to include each region having the signal line 6 projected on the principal surface of the flexible insulative substrate 30 (signal line region R1 mentioned later).

Notably, the ground layer of the strip line is not limited to the case of being constituted only of the ground thin film 14a. For example, the ground layer may be constituted of the ground thin film 14a in the folding part F1 and a relatively thick conductive layer in a portion other than the folding part F1. Herein, the conductive layer is constituted, for example, of a metal foil of a metal foil clad laminated sheet and a plating coat formed on the metal foil.

The ground thin film 14a constitutes the ground layer at least in the folding part F1 out of the ground layer of the strip line. This ground thin film 14a is constituted of a nonelectrolytic plating coat formed on the flexible insulative substrate 30 by a nonelectrolytic plating method. For example, the ground thin film 14a is composed of nonelectrolytic copper plating. The thickness of the nonelectrolytic plating coat constituting the ground thin film 14a is preferably 0.1 µm to 1.5 µm. The thickness of the nonelectrolytic plating coat is still preferably 0.5 µm to 1 µm. In this way, the thinness of the ground thin film 14a can sufficiently secure foldability of the strip line.

The protective layer 20 covers the ground thin film 14a and is in close contact with an exposed part 19 from which the flexible insulative substrate 30 is exposed (see FIG. 13B). The exposed part 19 is a portion, out of the surface of the flexible insulative substrate 30, that is not covered with a conductive layer such as the ground thin film 14a but from which the flexible insulative substrate 30 is exposed.

The protective layer 20 is in close contact with the exposed part 19 and covers the ground thin film 14a. The ground thin film 14a is pressed onto the flexible insulative substrate 30 by the protective layer 20. Therefore, the ground thin film 14a can be suppressed from being peeled off the flexible insulative substrate 30 in folding the strip line.

Notably, the protective layer 20 may be provided so as to cover the whole ground layer of the strip line or may be provided so as to cover only the ground thin film 14a.

In the present embodiment, as shown in FIG. 1, the exposed parts 19 are provided on both sides of the ground thin film 14a so as to extend along the direction in which the signal lines 6 extend. The protective layer 20 is in close contact with the exposed parts 19 on both sides of the ground thin film 14a, and thereby, can tightly pressing the ground thin film 14a onto the flexible insulative substrate 30. As a result, deficiency of close contact between the ground thin film 14a composed of a nonelectrolytic plating coat and the flexible insulative substrate 30 can be effectively supplemented.

Notably, exposed parts corresponding to the exposed part 19 may be provided in the ground thin film 14a. In this case, in the ground thin film 14a, opening parts from the bottom faces of which the flexible insulative substrate 30 is exposed (ground thin film opening parts 23) are provided (see FIG. 15). It should be noted that the ground thin film opening parts 23 are needed to be provided to such an extent that the function of the ground thin film 14a as the solid ground is not impaired.

As mentioned above, in the multilayer flexible printed circuit board 100 according to the present embodiment, the ground layers of the strip line are constituted of the ground thin films 14a at least in the folding part F1. The ground thin films 14a are constituted of nonelectrolytic plating coats formed on the flexible insulative substrate 30 by a nonelectrolytic plating method. In this way, the ground thin film 14a can be prevented from breaking or the similar situation even when the strip line is folded many times.

Furthermore, the protective layers 20 which cover the ground thin films 14a and are in close contact with the flexible insulative substrate 30 at the exposed parts 19 are provided. In this way, the ground thin film 14a can be suppressed from being peeled off the flexible insulative substrate 30 in folding the strip line. Notably, even if the ground thin film 14a is peeled off the flexible insulative substrate 30, since the protective layer 20 is in close contact with the flexible insulative substrate 30 at the exposed part 19 and covers the ground thin film 14a, the ground thin film 14a is prevented from dropping off the flexible insulative substrate 30.

Therefore, according to the present embodiment, a multilayer flexible printed circuit board having a strip line advantageous to folding can be provided.

Moreover, in the multilayer flexible printed circuit board 100 according to the present embodiment, since the ground thin film 14a is constituted of a nonelectrolytic plating coat as mentioned above, roughness of the face (inside face), of the ground thin film 14a, opposite to the signal lines 6 is sufficiently smaller than roughness (approximately the same as the thickness of an adhesive agent) of the inside face of a metal foil in the case where the metal foil such as a copper foil is pasted on the flexible insulative substrate 30 using the adhesive agent containing conductive filler. Therefore, according to the present embodiment, when high-speed signals are transmitted through the strip line, transmission losses and deterioration of signal quality can be suppressed.

Notably, in order to improve close contact between the protective layer 20 and the ground thin film 14a (or the flexible insulative substrate 30), the multilayer flexible printed circuit board 100 may further include an interlayer conductive path (a through hole, a via or the like) covered with the protective layer 20. The interlayer conductive path is provided so as not to be in contact with the signal lines 6. Namely, the interlayer conductive path is provided so as not to overlap with each signal line region having the signal line projected on the metal foil.

For example, as shown in FIG. 16, the multilayer flexible printed circuit board 100 further includes through holes 24 disposed in the ground thin films 14a. These through holes 24 are preferably provided in the folding part F1 of the strip line. Since the protective layers 20 bite the insides and the peripheral parts of the through holes 24, close contact between the protective layers 20 and the ground thin films 14a can be improved by an anchor effect. As a result, the ground thin film 14a can be more effectively suppressed from being peeled off the flexible insulative substrate 30 in folding the strip line.

In the example of FIG. 16, the interlayer conductive path is the through hole 24 which is disposed in the ground thin films 14a and electrically connects the ground thin films 14a on both sides of the flexible insulative substrate 30. To provide such through holes enables the potentials of the ground thin films 14a above and below the signal lines 6 to be held uniform. As a result, a multilayer flexible printed circuit board advantageous to performing high-speed transmission can be obtained.

Figure 17:
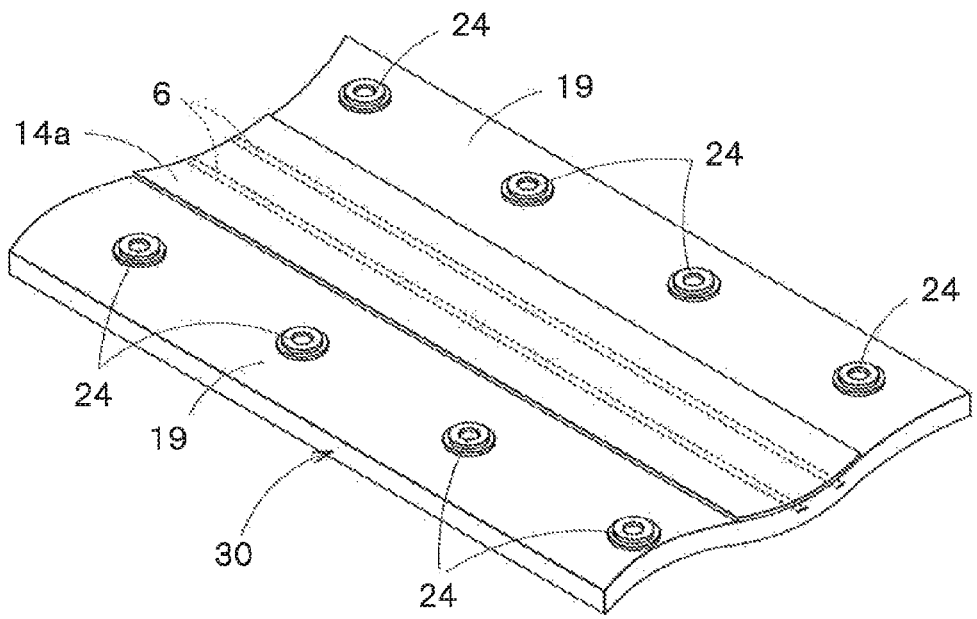
FIG. 17 is a perspective view showing a part of a multilayer flexible printed circuit board according to a third modification.

Notably, as shown in FIG. 17, the interlayer conductive paths (through holes 24) may be disposed in the exposed parts 19. In this case, close contact between the protective layers 20 and the flexible insulative substrate 30 can be improved by an anchor effect. As a result, the ground thin film 14a can be more effectively suppressed from being peeled off the flexible insulative substrate 30 in folding the strip line.

<Method of Manufacturing Multilayer Flexible Printed Circuit Board 100>

Next, a method of manufacturing the multilayer flexible printed circuit board 100 is described with reference to FIG. 2A to FIG. 14. Notably, FIG. 2A to FIG. 13A show cross-sectional views corresponding to the A-A line in FIG. 1, and FIG. 2B to FIG. 13B show cross-sectional views corresponding to the B-B line in FIG. 1.

Figure 2B:
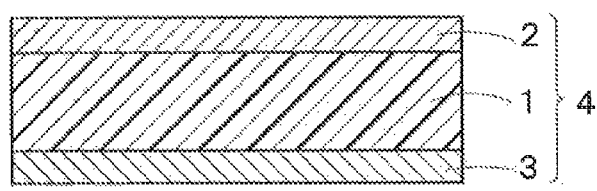
FIG. 2B shows process cross-sectional views for explaining a method of manufacturing a multilayer flexible printed circuit board according to the embodiment.

First, as shown in FIGS. 2A and 2B, a double-sided metal foil clad laminated sheet 4 having an insulative base material 1 and metal foils 2 and 3 provided on both sides thereof is prepared. The insulative base material 1 is a flexible insulative film (for example, with 50 μm of thickness). The metal foils 2 and 3 are, for example, copper foils (for example, with 12 μm of thicknesses). The metal foils 2 and 3 may be composed of metal other than copper (silver, aluminum, nickel or the like), or alloy.

The insulative base material 1 is preferably composed of a material low in dielectric constant such as polyimide. The reason is as follows. When the dielectric constant of the insulative base material 1 is high, the capacitance between the signal line and the ground layer is large in the strip line. Due to this, in order to obtain a desired characteristic impedance, the width of the signal line is needed to be narrow. Nevertheless, trying to make the width of the signal line narrow causes difficulty of wiring formation to be high, which leads to incapability of precise control of the characteristic impedance.

Moreover, since an adhesive material generally has a high dielectric constant, for the same reason as above, a nonadhesive metal foil clad laminated sheet not containing the adhesive material is desirably used as the double-sided metal foil clad laminated sheet 4. For example, as a nonadhesive copper clad laminated sheet, a copper polyimide substrate is used. The copper polyimide substrate has copper foils deposited on an insulative base material composed of polyimide by vapor deposition. On the copper polyimide substrate, the interface between the copper foil and the insulative base material is smooth and does not contain roughness, due to rear surface processing of a copper foil, which is caused in a general copper clad laminated sheet. Signal losses in high-speed transmission can be reduced. Herein, as the double-sided metal foil clad laminated sheet 4, a nonadhesive copper polyimide substrate (S'PERFLEX, Sumitomo Metal Mining Co. Ltd.) is prepared.

Figure 3A:
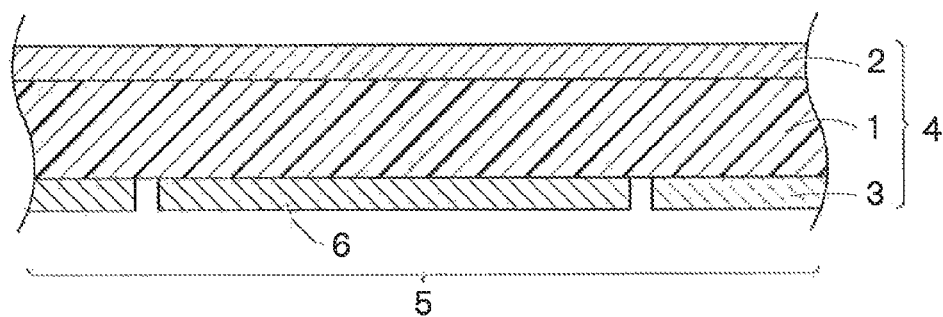
FIG. 3A shows process cross-sectional views for explaining the method of manufacturing a multilayer flexible printed circuit board according to the embodiment.
Figure 3B:
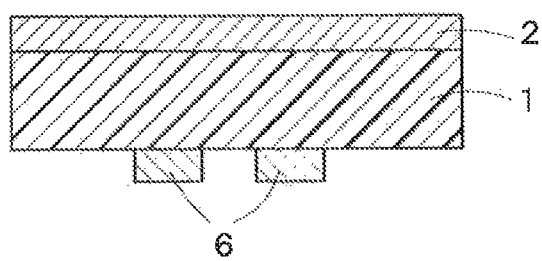
FIG. 3B shows process cross-sectional views for explaining the method of manufacturing a multilayer flexible printed circuit board according to the embodiment.

Next, as shown in FIGS. 3A and 3B, the metal foil 3 that becomes the inner layer side is patterned by a photofabrication technique (photoetching processing) to form the inner layer circuit pattern 5 including the signal lines 6. The line width of the signal line 6 is approximately 38 μm such that the characteristic impedance of the strip line is 50Ω.

Figure 5A:
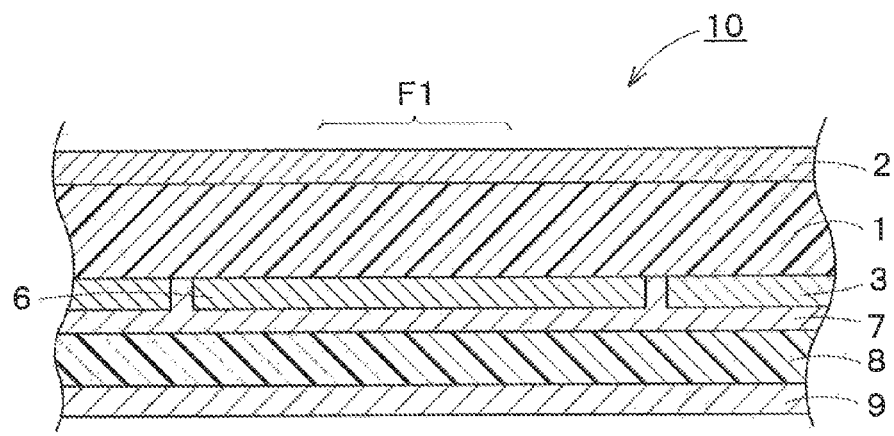
FIG. 5A shows process cross-sectional views for explaining the method of manufacturing a multilayer flexible printed circuit board according to the embodiment.
Figure 5B:
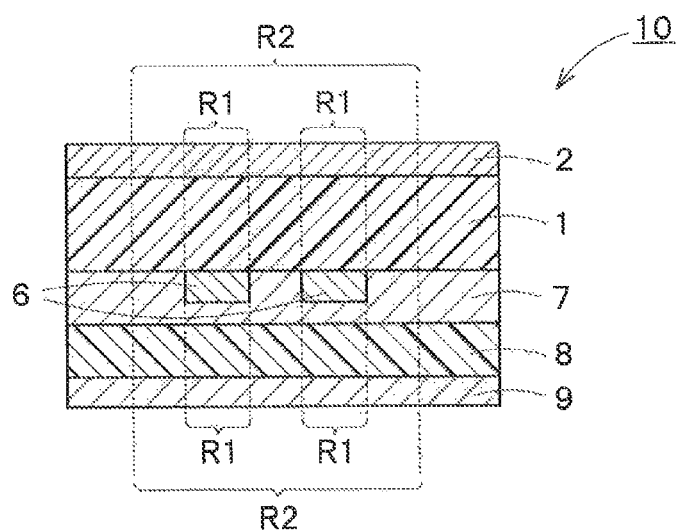
FIG. 5B shows process cross-sectional views for explaining the method of manufacturing a multilayer flexible printed circuit board according to the embodiment.

Next, as shown in FIGS. 4A and 4B, the double-sided metal foil clad laminated sheet 4 in which the metal foil 3 has been patterned and a single-sided metal foil clad laminated sheet 25 are pasted together via an adhesive agent sheet 7A under proper conditions to be integrated (integrating process). In this way, as shown in FIGS. 5A and 5B, a laminate body 10 having three conductive layers is obtained. Notably, through the integrating process, the adhesive agent sheet 7A becomes an adhesive agent layer 7.

Notably, the aforementioned single-sided metal foil clad laminated sheet 25 has an insulative base material 8 and a metal foil 9 provided on one side thereof. The insulative base material 8 is a flexible insulative film (for example, with 25 μm of thickness), and is preferably composed of a material low in dielectric constant such as polyimide similarly to the insulative base material 1. The metal foil 9 is, for example, a copper foil (for example, with 12 μm of thickness). The metal foil 9 may be composed of metal other than copper (silver, aluminum, nickel or the like), or alloy. Herein, as the single-sided metal foil clad laminated sheet 25, a nonadhesive copper polyimide substrate (S'PERFLEX, Sumitomo Metal Mining Co. Ltd.) is used.

Notably, the insulative base materials 1 and 8 may be composed of another flexible insulative material, not limited to polyimide. For example, they may be composed of a liquid crystal polymer (LCP: Liquid Crystal Polymer). The liquid crystal polymer can form a flexible substrate similarly to the case where polyimide is a base resin. Moreover, since it is lower in relative dielectric constant than polyimide and low in dielectric loss tangent, losses in high-speed signal transmission can be reduced. When using the liquid crystal polymer, the width of the signal lines 6 is set to be approximately 43 μm in order to set the characteristic impedance to be 50Ω.

The adhesive agent sheet 7A is preferably low in dielectric constant for high-speed transmission similarly to the insulative base materials 1 and 8. Herein, as the adhesive agent sheet 7A, a low dielectric constant adhesive agent (ADFLEMA, Namics Corporation) is used. The adhesive agent has adhesion to a smooth surface. Due to this, processing of improving adhesion, such as roughening processing, to the inner layer wiring pattern 5 is not needed, which is advantageous to high-speed transmission.

In the present embodiment, the thickness of the adhesive agent sheet 7A is 25 μm such that the signal lines 6 are positioned approximately at the center of the laminate body 10 in the thickness direction. Namely, the total value of the thickness of the insulative base material 8 and the thickness of the adhesive agent sheet 7A of the single-sided metal foil clad laminated sheet 25 is set to be equal to the thickness of the insulative base material 1 of the double-sided metal foil clad laminated sheet 4. In this way, the thicknesses above and below the signal lines 6 are approximately the same, which is advantageous to signal transmission. Furthermore, since the signal lines 6 are at the mechanical center in folding the strip line, stress exerted on the signal lines 6 in folding the strip line can be reduced.

The laminate body 10 has been prepared through the aforementioned processes. As shown in FIGS. 5A and 5B, the laminate body 10 has the flexible insulative substrate 30 constituted of the insulative base materials 1 and 8 and the adhesive agent layer 7, the inner layer circuit pattern 5 provided inside this flexible insulative substrate 30 and including the signal lines 6 extending in a predetermined direction, and the metal foils 2 and 9 covering both sides of the flexible insulative substrate 30.

In FIG. 5A, the folding part F1 denotes a portion, out of the strip line, folded in assembling a product using the multilayer flexible printed circuit board 100, in using the product or in the similar situation.

As shown in FIG. 5B, a signal line region R1 is a region having the signal line 6 projected on the metal foil 2 or 9. The ground layer of the strip line is formed so as to include the signal line regions R1.

Moreover, a ground layer formation scheduled region R2 is a region in which the ground layer of the strip line is scheduled to be formed. Namely, by etching processing using an etching mask 18 mentioned later, the ground layer of the strip line is to be formed in the ground layer formation scheduled region R2. Notably, the ground layer formation scheduled region R2 is rectangular in the present embodiment. It should be noted that the shape of the ground layer formation scheduled region R2 is not limited to this but takes a shape (mesh shape or the like) corresponding to a ground layer to be formed.

Next, after producing the laminate body 10 as mentioned above, as shown in FIGS. 6A and 6B, etching processing is performed on the laminate body 10 to remove the metal foils 2 and 9 that are at least in the folding part F1 out of the ground layer formation scheduled region R2, forming opening parts 11 from the bottom faces of which the flexible insulative substrate 30 is exposed (opening part forming process). In this process, along with the opening parts 11, mask holes (conformal masks) 12 for forming conduction holes are formed by etching the metal foils 2 and 9. Namely, the opening parts 11 and the mask holes 12 are simultaneously formed.

Next, as shown in FIGS. 7A and 7B, laser processing using the mask holes 12 is performed (conformal mask processing) to form conduction holes 13. In the present embodiment, the conduction holes 13 are bottomed via holes from the bottom faces of which the inner layer circuit pattern 5 is exposed. Notably, in the case of forming a through hole as the conduction hole 13, the through hole penetrating the laminate body 10 in the thickness direction may be formed by laser processing or mechanical drilling processing.

Figure 8A:
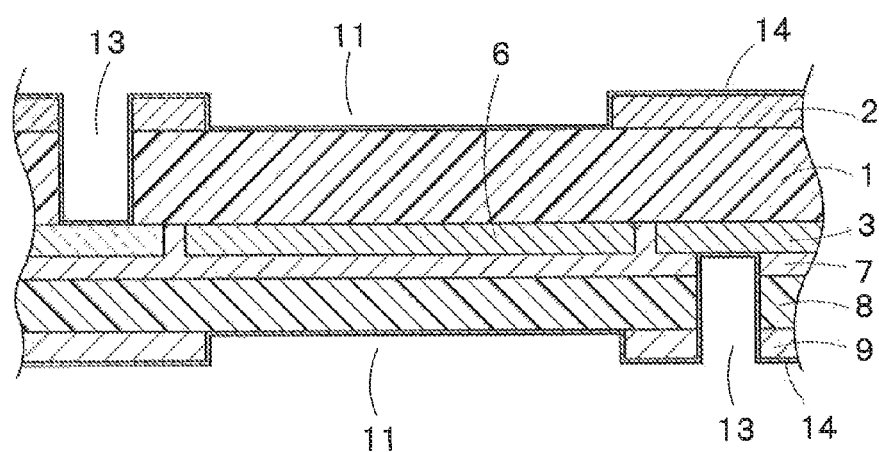
FIG. 8A shows process cross-sectional views for explaining the method of manufacturing a multilayer flexible printed circuit board according to the embodiment.
Figure 8B:
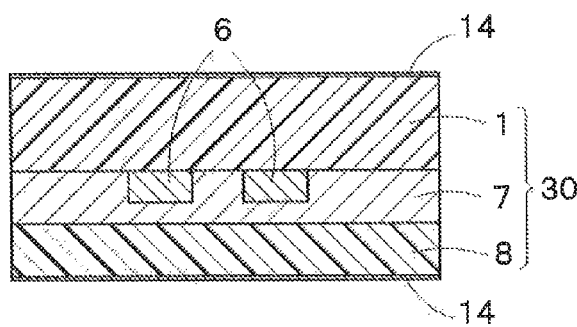
FIG. 8B shows process cross-sectional views for explaining the method of manufacturing a multilayer flexible printed circuit board according to the embodiment.

Next, as shown in FIGS. 8A and 8B, nonelectrolytic plating coats 14 are formed on the flexible insulative substrate 30 exposed from the bottom faces of the opening parts 11 by a nonelectrolytic plating method (nonelectrolytic plating process). For example, as the nonelectrolytic plating coats 14, nonelectrolytic copper plating coats are formed by a nonelectrolytic copper plating method. In this process, as well as in the opening parts 11 the nonelectrolytic plating coats 14 are formed in the conduction holes 13. Namely, a nonelectrolytic plating coat which becomes the ground thin film 14a in a later process and a nonelectrolytic plating coat which forms a via are simultaneously formed.

In the nonelectrolytic plating process, after performing cleaning on the conduction holes 13 (for example, desmear processing using permanganic acid), processing of making them conductive by nonelectrolytic copper plating is performed. In this way, the nonelectrolytic copper plating coats are formed on the entirety of the surfaces of the laminate body 10. Namely, the nonelectrolytic plating coats 14 are formed on the metal foils 2 and 9, the lateral faces and the bottom faces of the opening parts 11, and the side walls and the bottom faces of the conduction holes 13.

Notably, in the nonelectrolytic plating process, the nonelectrolytic plating coat 14 is preferably formed to have 0.1 µm to 1.5 µm of thickness. The nonelectrolytic plating coat 14 is still preferably formed to have 0.5 µm to 1 µm of thickness.

Next, as shown in FIGS. 9A and 9B, plating masks 15 that cover the opening parts 11 and do not cover the conduction holes 13 and their peripheral parts are formed on the surfaces of the laminate body 10. After that, as shown in FIGS. 10A and 10B, electrolytic plating coats 16 are formed in the conduction holes 13 and their peripheral parts by an electrolytic plating method (electrolytic plating process). For example, as the electrolytic plating coats 16, electrolytic copper plating coats are formed by an electrolytic copper plating method. Notably, since the plating masks 15 cover the opening parts 11, the electrolytic plating coats 16 are not formed in sites, out of the nonelectrolytic plating coats 14, that are to constitute the ground thin films 14a. Due to this, the thinness of the nonelectrolytic plating coats 14 is not impaired by the electrolytic plating process.

By forming the electrolytic plating coats 16, metal thickening for interlayer conduction is performed, which can secure durability of the interlayer conductive paths against temperature change or the like. Moreover, by forming the electrolytic plating coats 16 also in the peripheral parts of the conduction holes 13, thickening plating can be securely performed in the conduction holes 13 even when the formation positions of the plating masks 15 are displaced.

Vias 17 are produced as the interlayer conductive paths by the aforementioned electrolytic plating process. The via 17 electrically connects the inner layer circuit pattern 5 and the metal foil 2 (subsequent outer layer circuit pattern 22). Notably, when a through hole is formed as the conduction hole 13, the through hole is produced as the interlayer conductive path by this process.

Next, after removing the plating masks 15, as shown in FIGS. 11A and 11B, etching masks 18 which cover the nonelectrolytic plating coats 14 formed on the bottom faces of the opening parts 11 are formed (etching mask forming process). Moreover, the etching mask 18 is formed so as to have a shape corresponding to a desired outer layer circuit pattern. Notably, the etching masks 18 also cover the vias 17.

Next, as shown in FIGS. 12A and 12B, the nonelectrolytic plating coats 14 that are not covered by the etching masks 18 (or conductive layers composed of the nonelectrolytic plating coats 14 and the metal foil 2 (and the metal foil 9)) are removed to form the exposed parts 19 from which the flexible insulative substrate 30 is exposed (exposed part forming process). The exposed parts 19 are formed so as to extend on both sides of the ground thin film 14a along the direction in which the signal lines 6 extend (see FIG. 14). Moreover, by this process, the ground thin films 14a constituted of the nonelectrolytic plating coats 14 are formed at least in regions, out of the ground layer formation scheduled regions R2, corresponding to the folding part F1.

In the exposed part forming process, the ground thin films 14a and the exposed parts 19 are formed and the outer layer circuit patterns 22 are formed, by the etching processing using the etching masks 18. Namely, by this etching processing, the ground thin films 14a, the exposed parts 19 and the outer layer circuit patterns 22 (the lands 22a, the connector terminals 22b and the like) are simultaneously formed. After completion of the etching processing, the etching masks 18 are removed.

Figure 14:
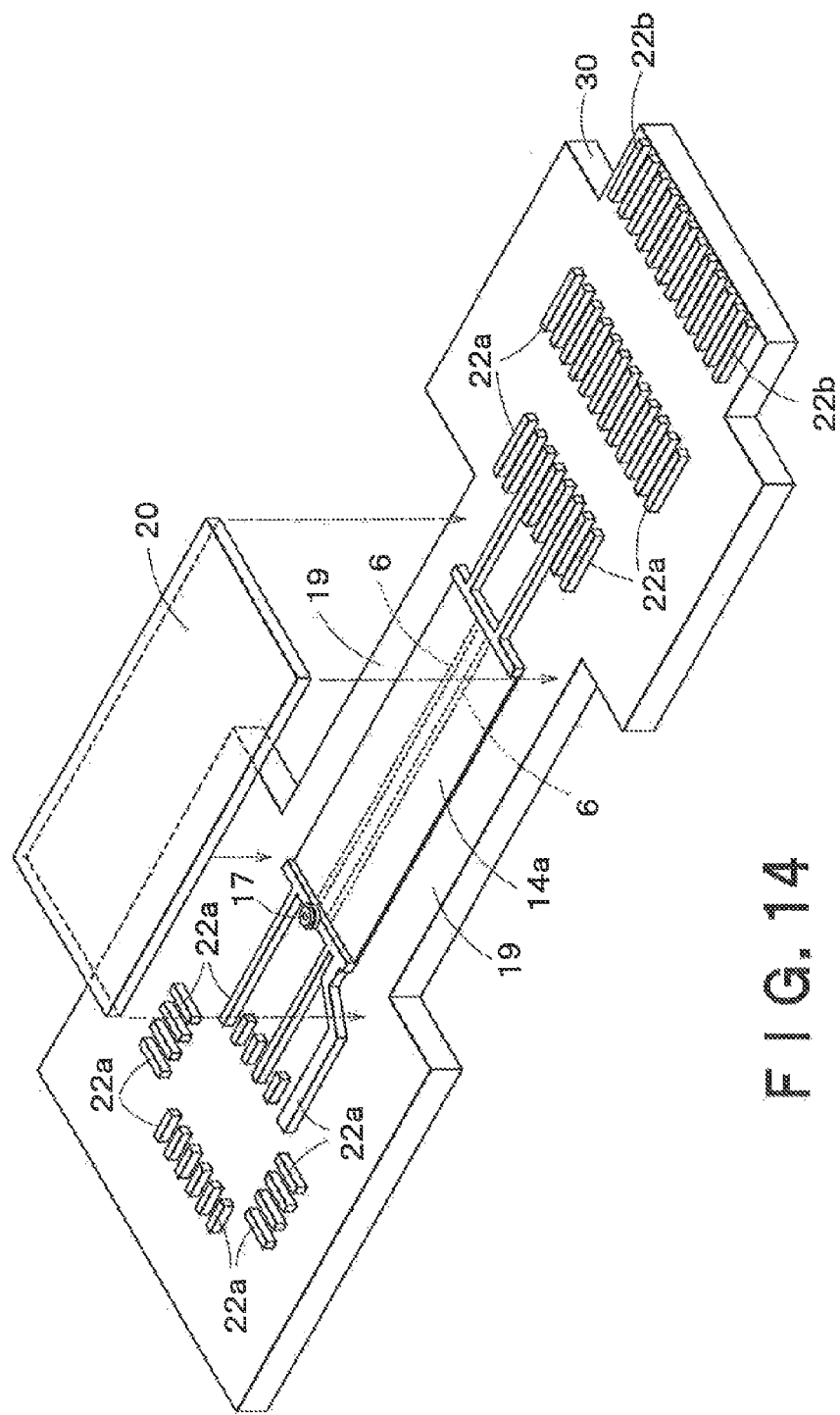
FIG. 14 is a perspective view for explaining a process of forming a protective layer 20.

Next, as shown in FIGS. 13A and 13B, the protective layers 20 which cover the ground thin films 14a and are in close contact with the exposed parts 19 are formed (protective layer forming process). As shown in FIG. 14, in the present embodiment, the protective layer 20 is formed so as to cover the whole ground thin film 14a. Notably, as shown in FIG. 13A, contact holes 21 from the bottom faces of which the outer layer circuit patterns 22 are exposed may be provided in the protective layers 20.

The protective layer 20 is formed, for example, using a cover lay. More in detail, the protective layer 20 is formed by pasting, on the laminate body 10, a cover lay (not shown) having an insulative film composed of polyimide or the like and an adhesive agent layer formed on one side thereof. The cover lay is laminated on the laminate body 10 so as to come into close contact with the exposed part 19.

Notably, before pasting the cover lay, an opening may be provided at a predetermined position of the cover lay. For example, in order to form the aforementioned contact holes 21, a cover lay in which openings are provided at their corresponding positions may be used.

Moreover, the protective layer 20 may be formed with a cover coat. For example, the protective layer 20 is formed by printing varnish-like resin on the surface of the laminate body 10 by screen printing or the like. Photosensitive resin may be applied onto the surface of the laminate body 10 to expose and develop this resin film for its patterning. Any of these techniques can form the protective layer 20 with a desired shape.

Through the aforementioned processes, the protective layers 20 that are in close contact with the insulative base materials 1 and 8 in the exposed parts 19 and cover the ground thin films 14a are formed. In this way, the ground thin film 14a composed of the nonelectrolytic plating coat 14 low in adhesion with the insulative base material 1, 8 of polyimide or the like can be suppressed from being peeled off the insulative base material 1, 8 (flexible insulative substrate 30) in folding the strip line.

Moreover, as mentioned above, in the opening part forming process, the opening parts 11 and the mask holes 12 are simultaneously formed by etching the metal foils 2 and 9. In other words, the opening parts 11 for forming the ground thin films 14a are formed in the process, of forming the mask holes 12, which have been performed in manufacturing a conventional multilayer flexible printed circuit board. Therefore, according to the present embodiment, a multilayer flexible printed circuit board having a strip line can be efficiently manufactured while preventing increase of the number of processes.

Moreover, as mentioned above, in the nonelectrolytic plating process, the nonelectrolytic plating coats 14 are simultaneously formed in the opening parts 11 and the conduction holes 13. In other words, the nonelectrolytic plating coats constituting the ground thin films 14a are formed in the process, of processing of making the conduction holes 13 conductive, that has been performed in manufacturing a conventional multilayer flexible printed circuit board. Therefore, according to the present embodiment, a thin film metal layer (nonelectrolytic plating coat 14) advantageous to folding can be formed without increase of the number of processes.

Moreover, as mentioned above, in the exposed part forming process, the ground thin films 14a, the exposed parts 19 and the outer layer circuit patterns 22 are simultaneously formed by the etching processing using the etching masks 18. In other words, the ground thin films 14a and the exposed parts 19 are formed in the process, of forming the outer layer circuit patterns 22, that has been performed in manufacturing a conventional multilayer flexible printed circuit board. Therefore, according to the present embodiment, a multilayer flexible printed circuit board having a strip line can be efficiently manufactured while preventing increase of the number of processes.

Moreover, since each aforementioned process can be performed within typical manufacturing processes of a multilayer flexible printed circuit board, there is no special equipment or increase of the number of processes. Accordingly, the multilayer flexible printed circuit board 100 according to the present embodiment can be manufactured at approximately the same costs in approximately the same manufacturing time as those for a conventional multilayer flexible printed circuit board.

Notably, it is known that the nonelectrolytic plating coat 14 generally has a smooth surface. Therefore, the protective layer 20 may be formed using a material with adhesion to the nonelectrolytic plating coat 14 in order to supplement deficiency of close contact between the nonelectrolytic plating coat 14 and the insulative base material 1, 8. For example, the protective layer 20 is formed using a low dielectric constant adhesive agent (ADFLEMA, Namics Corporation), which has adhesion to a smooth surface.

Moreover, between the nonelectrolytic plating process and the protective layer forming process, there may be further included a process of depositing fine metal crystals on the nonelectrolytic plating coat 14 to roughen the surface thereof. For example, before forming the protective layer 20, nonetchable processing of depositing fine crystals (blackening reduction processing or the like) is performed on the nonelectrolytic plating coat 14 to roughen the surface of the nonelectrolytic plating coat 14. In this way, the surface area of the nonelectrolytic plating coat 14 can be increased to enhance adhesion between the protective layer 20 and the nonelectrolytic plating coat 14. Notably, the processing of depositing fine crystals is performed, for example, using sodium chlorite (Silbrite, Japan Carlit Co. Ltd.) or the like to deposit crystals of copper oxide on the surface of a nonelectrolytic copper plating coat. In this way, a roughening shape of the surface of the nonelectrolytic plating coat 14 is obtained.

Moreover, between the nonelectrolytic plating process and the protective layer forming process, there may be further included a process of performing chemical processing on the nonelectrolytic plating coat 14 using a nonetchable adhesion assistant in order to improve adhesion to the protective layer 20. This chemical processing can form an adhesion assistant layer (not shown) on the surface of the nonelectrolytic plating coat 14 to enhance adhesion between the protective layer 20 and the nonelectrolytic plating coat 14. For example, as the adhesion assistant, Secure HFz (Atotech Japan) can be applied.

Notably, the reason why any of the aforementioned surface roughening processing and chemical processing is nonetchable processing is that since the nonelectrolytic plating coat 14 is exceedingly thin, etching is difficult to form the roughening shape thereon.

Moreover, any of the aforementioned surface roughening processing and the chemical processing is performed on the surface (outside surface), of the ground thin film 14*a*, reverse to the surface (inside surface) opposite to the signal lines 6. Since the current of a high-speed signal flows on the inside surface of the ground thin film 14*a* due to a skin effect, the outside surface of the ground thin film 14*a* is not a portion contributing high-speed transmission. Due to this, even when the aforementioned surface roughening processing or chemical processing increases roughness on the outside surface of the ground thin film 14*a*, transmission losses and deterioration of signal quality can be prevented. More in detail, transmission losses or the like due to imbalance in transmission distances on the ground thin film 14*a* and the signal line 6 can be prevented.

Next, four modifications (first to fourth modifications) according to the embodiment of the present invention are described with reference to FIG. 15 to FIG. 18. With any of the modifications, the similar effects to those of the embodiment can be obtained. Notably, FIG. 15 to FIG. 18 do not show the protective layers 20.

(First Modification)

Figure 15:
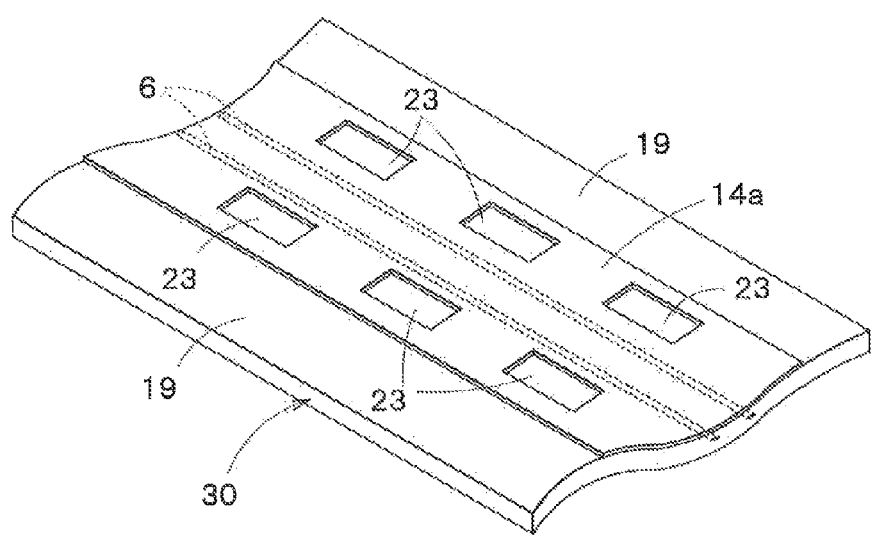
FIG. 15 is a perspective view showing a part of a multilayer flexible printed circuit board according to a first modification.

In this modification, as shown in FIG. 15, opening parts (ground thin film opening parts 23) are provided in the ground thin film 14*a*. Specifically, in the etching mask forming process, the etching mask 18 in which openings are provided in the regions in which the ground thin film opening parts 23 are to be provided is formed. Then, in the exposed part forming process, the ground thin film 14*a* that is exposed from the openings of the etching mask 18 is removed to form the ground thin film opening parts 23. In this way, the ground thin film opening parts 23 can be formed without increasing the number of processes.

The ground thin film opening parts 23 are formed so as not to overlap with the signal line regions R1. For example, as shown in FIG. 15, the ground thin film opening parts 23 are formed along the signal lines 6 so as not to overlap with the signal line regions R1. Notably, when the plurality of signal lines 6 are provided, the ground thin film opening parts 23 may be formed between the signal line regions R1.

The ground thin film opening parts 23 are provided to such an extent that the function of the ground thin film 14*a* as a solid ground is not impaired. Namely, formation positions, dimensions, shapes, the number and the like of the ground thin film opening parts 23 are determined so as not to impair the function as a solid ground. Not limited to a rectangular shape as shown in FIG. 15, the shape of the ground thin film opening part 23 may be another shape (for example, a circular shape, grid shape, mesh shape or the like).

By forming the ground thin film opening parts 23, the protective layer 20 also comes into close contact with exposed parts in the ground thin film 14*a* (that is, the flexible insulative substrate 30 that is exposed from the bottom faces of the ground thin film opening parts 23) in addition to the exposed parts 19 on both sides of the ground thin film 14*a*. In this way, the contact surface area is increased, and adhesion between the protective layer 20 and the flexible insulative substrate 30 can be improved. As a result, the ground thin film 14*a* can be more effectively suppressed from being peeled off the flexible insulative substrate 30 in folding the strip line.

Notably, it is not essential to form both of the exposed parts 19 and the ground thin film opening parts 23. For example, the exposed parts 19 not formed, the protective layer 20 may be formed so as to come into close contact only with the exposed parts of the ground thin film opening parts 23.

(Second Modification)

In this modification, as shown in FIGS. 16A and 16B, the plurality of through holes 24 are produced along the signal line 6 so as not to overlap with the signal line regions R1.

The plurality of through holes 24 are produced through the same processes as those for the aforementioned vias 17. When the through holes 24 are produced, in the conformal mask processing, through holes which penetrate the laminate body 10 in the thickness direction are formed as the conduction holes 13. The through holes 24 are produced in the ground layer formation scheduled regions R2, and produced at least in the ground layer formation scheduled regions R2 at the folding part F1. Then, in the protective layer forming process, the protective layers 20 are formed so as to cover the through holes 24. Notably, vias may be provided as the interlayer conductive paths, not limited to the through holes. Namely, not limited to through holes, the interlayer conductive paths may be vias.

By providing the through holes 24, since the protective layer 20 bites the insides and the peripheral parts of the through holes 24, adhesion between the protective layer 20 and the ground thin film 14*a* can be improved by an anchor effect. As a result, the ground thin film 14*a* can be more effectively suppressed from being peeled off the flexible insulative substrate 30 in folding the strip line.

The through hole 24 is not connected to the signal lines 6 but electrically connects the ground thin films 14*a* on both sides of the flexible insulative substrate 30. In this way, ground potentials in the upper part and the lower part of the strip line can be more securely set to be approximately the same across a wide region of the strip line. As a result, a multilayer flexible printed circuit board advantageous to performing high-speed transmission can be obtained.

(Third Modification)

While in the second modification, the through holes 24 are disposed in the ground thin film 14*a*, the through holes 24 are disposed in the exposed parts 19 in the third modification as shown in FIG. 17. In this way, the protective layer 20 can bite the insides and the peripheral parts of the through holes 24 to improve adhesion between the protective layer 20 and the flexible insulative substrate 30 by an anchor effect. As a result, the ground thin film 14*a* can be more effectively suppressed from being peeled off the flexible insulative substrate 30 in folding the strip line.

(Fourth Modification)

Figure 18:
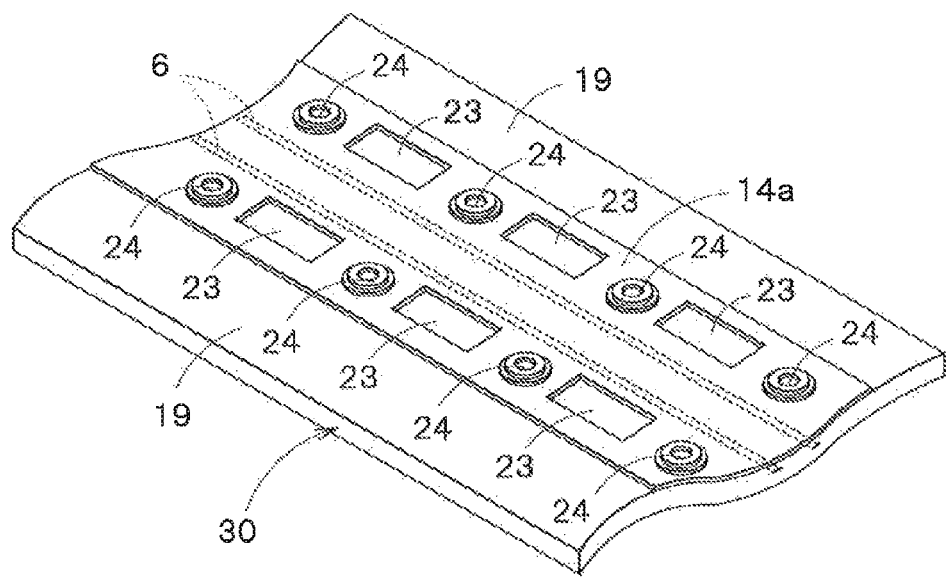
FIG. 18 is a perspective view showing a part of a multilayer flexible printed circuit board according to a fourth modification.

The fourth modification corresponds to a combination of the first modification and the second modification. Namely, in this modification, as shown in FIG. 18, the through holes 24 are provided between the ground thin film opening parts 23. In this way, adhesion between the protective layer 20 and the flexible insulative substrate 30 can be further improved.

While, based on the aforementioned description, the skilled in the art may be able to envision various modifications and additional effects of the present invention, embodiments of the present invention are not intended to be limited to the aforementioned embodiment and modifications. Additions, modifications and partial eliminations are possible in a variety of ways without departing from the scope and spirit of the present invention derived from the contents as defined in the appended claims and their equivalents.

REFERENCE SIGNS LIST

1 Insulative base material
2, 3 Metal foil

4 Double-sided metal foil clad laminated sheet
5 Inner layer circuit pattern
6 Signal line
7 Adhesive agent layer
7A Adhesive agent sheet
8 Insulative base material
9 Metal foil
10 Laminate body
11 Opening part
12 Mask hole
13 Conduction hole
14 Nonelectrolytic plating coat
14a Ground thin film
15 Plating mask
16 Electrolytic plating coat
17 Via
18 Etching mask
19 Exposed part
20 Protective layer
21 Contact hole
22 Outer layer circuit pattern
22a Land
22b Connector terminal
23 Ground thin film opening part
24 Through hole
25 Single-sided metal foil clad laminated sheet
30 Flexible insulative substrate
100 Multilayer flexible printed circuit board
F1 Folding part
R1 Signal line region
R2 Ground layer formation scheduled region

The invention claimed is:

1. A method of manufacturing a multilayer flexible printed circuit board having a strip line foldable at a folding part, the method comprising:
  a process of preparing a laminate body having a flexible insulative substrate, an inner layer circuit pattern provided inside the flexible insulative substrate and including a signal line extending in a predetermined direction, and metal foils covering both sides of the flexible insulative substrate;
  an opening part forming process of removing the metal foils at least in the folding part out of a ground layer formation scheduled region to form an opening part from a bottom face of which the flexible insulative substrate is exposed;
  a nonelectrolytic plating process of forming a nonelectrolytic plating coat on the flexible insulative substrate that is exposed from the bottom face of the opening part by a nonelectrolytic plating method;
  an etching mask forming process of forming an etching mask covering the nonelectrolytic plating coat;
  an exposed part forming process of removing the nonelectrolytic plating coat that is not covered by the etching mask to form a ground thin film constituted of the nonelectrolytic plating coat and an exposed part from which the flexible insulative substrate is exposed; and
  a protective layer forming process of forming a protective layer that covers the ground thin film and is in close contact with the exposed part.

2. The method of manufacturing a multilayer flexible printed circuit board according to claim 1, wherein
  in the opening part forming process, a mask hole for forming a conduction hole is formed along with the opening part by etching the metal foil,
  between the opening part forming process and the nonelectrolytic plating process, laser processing using the mask hole is performed to form the conduction hole,
  in the nonelectrolytic plating process, a nonelectrolytic plating coat is formed in the conduction hole as well as in the opening part,
  between the nonelectrolytic plating process and the etching mask forming process, a plating mask that covers the opening part and does not cover the conduction hole or a peripheral part of the conduction hole peripheral part is formed, after that, an electrolytic plating coat is formed in the conduction hole and the peripheral part of the conduction hole peripheral part by an electrolytic plating method to produce an interlayer conductive path,
  in the etching mask forming process, the etching mask is formed so as to have a shape corresponding to a desired outer layer circuit pattern after removing the plating mask, and
  in the exposed part forming process, the ground thin film and the exposed part are formed and the outer layer circuit pattern is formed by etching processing using the etching mask.

3. The method of manufacturing a multilayer flexible printed circuit board according to claim 2, wherein the interlayer conductive path is produced so as not to overlap with a signal line region having the signal line projected on the metal foil, and the protective layer is formed so as to cover the interlayer conductive path.

4. The method of manufacturing a multilayer flexible printed circuit board according to claim 1, wherein in the exposed part forming process, the exposed part is formed so as to extend on both sides of the ground thin film in the direction in which the signal line extends.

5. The method of manufacturing a multilayer flexible printed circuit board according to claim 1, wherein in the exposed part forming process, a ground thin film opening part from a bottom face of which the flexible insulative substrate is exposed is formed in the ground thin film.

6. The method of manufacturing a multilayer flexible printed circuit board according to claim 1, wherein in the nonelectrolytic plating process, the nonelectrolytic plating coat is formed to have 0.1 μm to 1.5 μm of thickness.

7. The method of manufacturing a multilayer flexible printed circuit board according to claim 1, wherein in the protective layer forming process, the protective layer is formed of a material having adhesion to the nonelectrolytic plating coat.

8. The method of manufacturing a multilayer flexible printed circuit board according to claim 1, further comprising, between the nonelectrolytic plating process and the protective layer forming process, a process of depositing fine metal crystals on the nonelectrolytic plating coat to roughen a surface of the nonelectrolytic plating coat.

9. The method of manufacturing a multilayer flexible printed circuit board according to claim 1, further comprising, between the nonelectrolytic plating process and the protective layer forming process, a process of performing chemical processing using a nonetchable adhesion assistant on the nonelectrolytic plating coat.

* * * * *